(12) United States Patent
Kohlscheen

(10) Patent No.: US 9,126,273 B2
(45) Date of Patent: Sep. 8, 2015

(54) TOOL FOR THE CUTTING MACHINING OF WORKPIECES AND PROCESS FOR COATING SUBSTRATE BODIES

(71) Applicant: Kennametal, Inc., Latrobe, PA (US)

(72) Inventor: Joern Kohlscheen, Bremen (DE)

(73) Assignee: KENNAMETAL INC, Latrobe, PA (US)

( * ) Notice: Subject to any disclaimer, the term of this patent is extended or adjusted under 35 U.S.C. 154(b) by 0 days.

(21) Appl. No.: 14/107,268

(22) Filed: Dec. 16, 2013

(65) Prior Publication Data

US 2014/0169891 A1 Jun. 19, 2014

Related U.S. Application Data

(63) Continuation-in-part of application No. 14/103,023, filed on Dec. 11, 2013, now abandoned.

(30) Foreign Application Priority Data

Dec. 17, 2012 (DE) .......................... 10 2012 024 638

(51) Int. Cl.
- C23C 16/06 (2006.01)
- B23C 5/16 (2006.01)
- C23C 14/06 (2006.01)
- C23C 14/35 (2006.01)

(52) U.S. Cl.
CPC ............... B23C 5/16 (2013.01); C23C 14/0641 (2013.01); C23C 14/352 (2013.01); *Y10T 407/1904* (2015.01)

(58) Field of Classification Search
USPC ............ 51/307, 309; 428/325, 336, 697, 698, 428/699, 704
See application file for complete search history.

(56) References Cited

U.S. PATENT DOCUMENTS

| | | | | |
|---|---|---|---|---|
| 5,318,840 A | * | 6/1994 | Ikeda et al. | 428/336 |
| 5,580,653 A | * | 12/1996 | Tanaka et al. | 51/307 |
| 5,863,397 A | | 1/1999 | Tu et al. | |
| 6,309,738 B1 | * | 10/2001 | Sakurai | 428/699 |
| 7,094,479 B2 | * | 8/2006 | Sato et al. | 428/698 |
| 7,462,375 B2 | | 12/2008 | Ge | |
| 7,704,611 B2 | | 4/2010 | Coddet et al. | |

(Continued)

FOREIGN PATENT DOCUMENTS

| | | | |
|---|---|---|---|
| JP | 07-097679 | * | 4/1995 |
| JP | 11-061380 | * | 3/1999 |
| KR | 20030057499 | * | 10/2003 |

OTHER PUBLICATIONS

English abstract of KR20030057499.*

(Continued)

*Primary Examiner* — Archene Turner
(74) *Attorney, Agent, or Firm* — Matthew Gordon

(57) ABSTRACT

The invention relates to a tool having at least one layer of $Ti_xAl_{1-x}N$, where $0.2 \leq x \leq 0.8$, which is composed of a plurality of laminar plies to give an overall layer thickness of 0.01 µm to 3 µm and which has crystallites having a size of $\leq 10$ nm. To produce such a layer, by magnetron sputtering in an $N_2$ atmosphere, Ti and Al are respectively released from separately arranged cathode targets, wherein the tool is moved past the cathode repeatedly at a speed which is such that in each case only a nanocrystalline layer forms upon this movement.

8 Claims, 1 Drawing Sheet

(56) References Cited

U.S. PATENT DOCUMENTS

| | | | |
|---|---|---|---|
| 7,988,832 | B2 | 8/2011 | Derflinger et al. |
| 8,173,248 | B2 | 5/2012 | Hovsepian et al. |
| 2002/0160235 | A1 | 10/2002 | Caminiti |
| 2005/0170091 | A1 | 8/2005 | Ge |
| 2007/0157525 | A1 | 7/2007 | Egan et al. |
| 2007/0231501 | A1 | 10/2007 | Finley |
| 2008/0289957 | A1 | 11/2008 | Takigawa et al. |
| 2010/0062257 | A1 | 3/2010 | Morstein et al. |
| 2011/0180389 | A1 | 7/2011 | Cremer et al. |
| 2012/0168304 | A1 | 7/2012 | Le et al. |

OTHER PUBLICATIONS

Bobzin et al "Grain size evalustion of pulsed TiAlN nanocomposite coatings for cutting tools". Thin Solid Films 515 (2007) p. 3681-3684.*

Astrand, M et al., Deposition of Ti1-xAlxN using bipolar pulsed dual magnetron sputtering. In: Surface & Coatings Technology, 200, 2005, 625-629, 2005, 625-629.

Manaila, R. et al., Multilayer TiAlN coatings with composition gradient. In: Surface & Coatings Technology, 151-152, 2002, 21 25, 2002, 21-25.

Zywitzki, O et al., Structure of superhard nanocrystalline (Ti,Al) N layers deposited by reactiv pulsed magnetron sputtering. In: Surface & Coatings Technology, 200, 2006, 6522-6526, 2006, 6522-6526.

Lv, Yanhong et al., "Influence of substrate bias voltage on structure and properties of the CrAlN films deposited by unbalanced magnetron sputtering", Applied Surface Science 258 (2012), pp. 3864-3870.

Ait-Djafer, Amina Zouina et al., "Deposition and characterization of titanium aluminum nitride coatings prepared by RF magnetron sputtering", Applied Surface Science (2015), pp. 1-4.

* cited by examiner

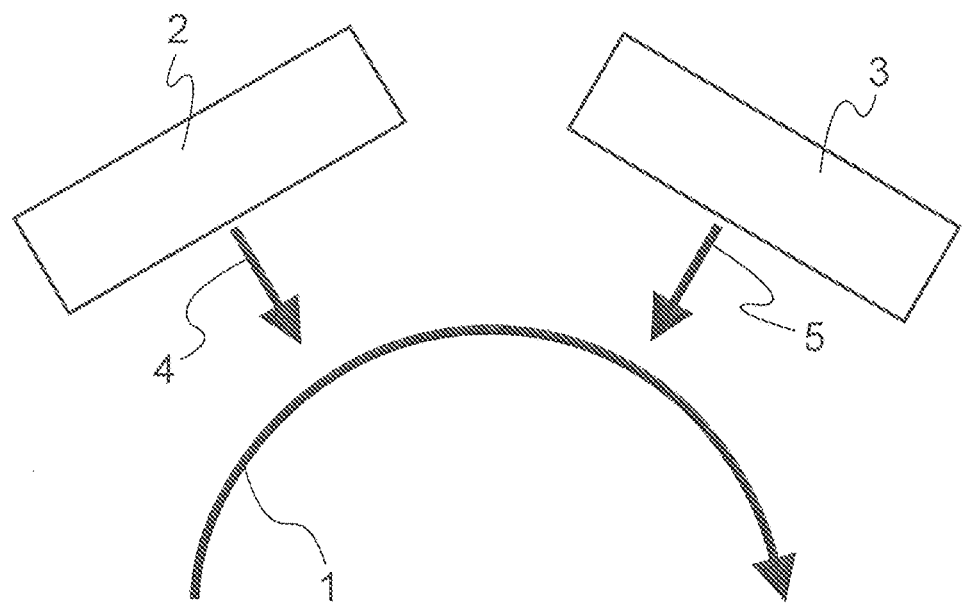

TOOL FOR THE CUTTING MACHINING OF WORKPIECES AND PROCESS FOR COATING SUBSTRATE BODIES

RELATED APPLICATION DATA

The present application is a continuation-in-part under 35 U.S.C. §120 of U.S. patent application Ser. No. 14/103,023 filed Dec. 11, 2013, which claims priority under 35 U.S.C. §119(a) to German Patent Application Number 102012024638.2 filed Dec. 17, 2012.

FIELD

The invention relates to a tool for the cutting machining of workpieces, in particular for milling cast iron workpieces, wherein the tool consists of a coated cemented carbide body having at least one layer of TiAlN. The invention further relates to a process for coating substrate bodies by means of magnetron sputtering for depositing one or more plies of $Ti_xAl_{1-x}N$.

BACKGROUND

For machining metallic materials such as cast iron, use is made of coated tools. The tool wear depends substantially on how resistant the tool cutting edge is to the detachment of individual fragments or the formation of cracks. If parts of the coating have already been detached during cutting, the wear progresses more quickly, and therefore the tool becomes unusable after a short time. Significant importance is attached to the selection of the coating since the layer properties significantly determine the wear progression. Thus, tools consisting of a cemented carbide substrate body which is coated with a plurality of layers by means of CVD have been proposed in the past, for example. Possible coatings consist, for example, of TiCN and an outer layer of $\alpha$-$Al_2O_3$. Similarly, a series of PVD coatings based on the material system TiAlN are known.

By way of example, DE 601 04 709 T2 describes the atomization of a sputtering target by bombardment with gas atoms and/or ions. The sputtering target used is, for example, a titanium plate, in which aluminum plugs have been inserted into existing boreholes. Atoms from the plate itself and from the plugs in the plate are evaporated from the surface of the sputtering target by the gas ion bombardment and change into the gas phase. When a Ti/Al sputtering target is used in a nitrogen atmosphere, a TiAlN layer containing approximately 25 atom % of both titanium and aluminum and up to 50 atom % nitrogen deposits on a substrate body, which can consist, for example, of a cemented carbide. In the case of smooth-faced Ti/Al sputtering targets, greater evaporation rates arise for aluminum than for the titanium, which has the effect that the aluminum plugs in the titanium plate wear away significantly more quickly than the plate itself. In order to provide a remedy here, it is proposed to select the shape of the exposed surface of the plugs in such a way that sputtering rates required for the desired layer composition are established for each metal upon atomization of the target. In particular, the surfaces of the plugs made of aluminum are inwardly curved.

In order to ensure uniform material removal, WO 2004/059030 A2 proposes evaporating the metallic proportion of the hard material layer from alloyed sources, the targets or cathodes.

US 2009/0130434 A1 proposes a coated tool consisting of a substrate body and a hard material coating which, in turn, contains two individual layers, of which the first has a thickness of 0.1 µm to 1 µm and consists of granular crystals with a mean crystal diameter of 0.01 to 0.1 µm, and the second layer has a thickness of 0.5 to 10 µm and is composed of columnar crystals which have grown in a direction perpendicular to the substrate body. The columnar crystals have a mean crystal width of 0.05 to 0.3 µm (in the direction parallel to the substrate body), the mean crystal width being greater than the mean crystal diameter of the first layer.

SUMMARY

It is an object of the present invention to specify a process for producing a tool and also a tool which has reduced tool wear upon cutting machining, in particular when milling cast workpieces.

This object is achieved, on the one hand, by the tool as claimed in claim 1, wherein, according to the invention, the layer consists of $Ti_xAl_{1-x}N$, where $0.2 \leq x \leq 0.8$, the crystallites present in this layer have a size of $\leq 100$ nm and wherein this layer is composed of a plurality of laminar plies to give a layer thickness of 0.1 µm to 3 µm.

Surprisingly, a cutting tool of this type exhibits a considerable improvement in service life compared to a single-ply TiAlN layer which has been produced by means of PVD with alloyed or plugged targets. The tool can be used, in particular, without utilizing cooling lubricants, which has the advantage that no additional high costs for the disposal of the coolant or the cutting chippings arise.

The object is further achieved by the process as claimed in claim 6, wherein the coating of $Ti_xAl_{1-x}N$ is produced by means of a reactive PVD process, in which, by magnetron sputtering in an $N_2$ atmosphere, aluminum and titanium have been released in the desired quantity and, after reacting to form $Ti_xAl_{1-x}N$, where $0.2 \leq x \leq 0.8$, have been deposited on a substrate body, wherein the substrate body is moved past the cathode repeatedly at a speed which is such that in each case only a nanocrystalline layer forms upon this movement, and the movement past is repeated until the desired layer thickness of 0.01 µm to 3 µm is reached. The high wear resistance of the tool produced in this way appears to be based on the use of pure metal targets, i.e. in particular only in each case a pure titanium target and a pure aluminum target. These two targets are arranged sufficiently close alongside one another so that, on the one hand, the formation of hexagonal, relatively soft AlN is avoided and, on the other hand, concentration gradients form in the growing layer as a result of the substrate bodies being moved cyclically past the metallic sources. This promotes the nanostructured formation of the hard material layer with a very small crystallite size. The layer structure thereby becomes more compact and more resistant to abrasion.

Advantageous embodiments are described in the respective dependent claims 2 to 5 and 7 to 11.

BRIEF DESCRIPTION OF THE DRAWINGS

FIG. 1 illustrates a method of producing a coated substrate according to one embodiment described herein.

DETAILED DESCRIPTION

Thus, it is preferable that a plurality of $Ti_xAl_{1-x}N$ layers which differ in each case in the Ti:Al ratio can be deposited on a cemented carbide body, the thickness of all the $Ti_xAl_{1-x}N$ layers being at most 10 µm. In a two-layered variant, the inner layer has a relatively large Al proportion, preferably where x<0.5, and the outer layer has a relatively small Al proportion, where 0.6≤x≤0.8.

The respective ratio of the titanium and of the aluminum in the TiAlN coating can be varied by appropriately setting the bombardment rate or the impact energy of the gas atoms and/or gas ions differently, such that, for example, more aluminum atoms are separated from the aluminum target than titanium atoms from the titanium target at the same time. The overall layer thickness of the TiAlN layer is between 0.5 µm and 10 µm, in which case it is preferable that a plurality of laminar layers of differing composition have been deposited one on top of another, of which each individual layer can have a layer thickness of 0.01 µm to 3 µm.

According to a further configuration of the invention, the titanium in the $Ti_xAl_{1-x}N$ layer or sublayer can be replaced entirely or in part by zirconium and/or hafnium, since these transition metals form a colored nitride. According to a further configuration of the invention, the aluminum in this layer can be replaced entirely or in part by silicon and/or boron and/or carbon. The change in the layer composition can produce different layer colors to the yellow metal nitride. On account of the reduced conductivity of said nonmetals, use is made of pulsed voltage sputtering. A plurality of coating sources (targets) can be simultaneously used alongside one another in each case during the coating, each individual target consisting in each case only of a single metal.

The process according to the invention has various advantages: firstly, the production of the coating for the tools is significantly more cost-effective, because the production of the metal targets common to date with plugs of a differing composition or the alloying of various metals is dispensed with. The bombardment rates and bombardment energies can also be set more easily and more precisely when unalloyed metal targets are used, and therefore, depending on the addition of aluminum, silicon or carbon atoms, the golden color can gradually be varied to a red or dark red and finally violet or dark gray color. This is effected in practice by varying the bombardment rate of the aluminum targets. Differently colored layers make it possible to establish the degree of wear of this layer in a simple manner. Finally, it is possible as a result of targeted layer compositions to establish improved adhesion of the coating to the substrate body and also of the different layers to one another. The separate metal targets make it possible in particular to use aluminum targets without a copper connection plate, which was required to date in the case of the plugged titanium plates on account of the low thermal conductivity.

The layers which have been produced have led to a considerable reduction in wear of the tool and to an increase in the milling length which can be achieved before the tool becomes unusable.

In a specific exemplary embodiment, a cemented carbide substrate body having the composition 94% by weight WC, 6% by weight Co has been coated in a sputter coating system with a multi-ply hard material layer having a thickness of approximately 6 µm. The PVD system used has a total of four cathodes, with two cathodes being arranged symmetrically on each side. The cathodes consist of in each case two aluminum targets and in each case two titanium targets. The atomization takes place in an $Ar/N_2$ plasma (gas flow Ar=500 sccm and $N_2$=130 sccm) by means of DC sputtering with a constant power of in each case 9.5 kW at the titanium targets. The power at the Al targets has been varied between 2 kW and 7 kW, as a result of which different aluminum contents are produced in the respectively deposited plies.

The cutting insert produced, which has a multi-ply TiAlN layer, is used for face milling nodular cast iron blocks. A first test involves the investigation of cemented carbide cutting inserts from the same production batch, which were coated in the same system with in each case segmented targets, i.e. Ti plates and also inserted Al plugs. The milling lengths achievable with this conventional coating were 4500 mm in a first test and 9000 mm in a repeated test.

By contrast, the cutting inserts coated according to the present invention achieved milling lengths of 15 000 mm in two different tests. The milling length therefore increases by a factor of 3 or 1.7.

In a further test, a cemented carbide having the composition 93% by weight WC, 7% by weight Co has been used as the base substrate. In the case of the conventional multi-ply coating using titanium plates with Al plugs, it was possible to achieve milling lengths of 6000 mm. In the case of the multi-ply coating according to the invention, the milling lengths were by contrast 9000 mm and 7500 mm. Here, too, there is therefore an increased milling length, which is 1.25 or 1.5 times greater.

The tool parameters used were as follows:
$V_c$=250 m/min, f=0.25 mm, ap=20 mm, corner milling with WSP type:
XPHT160412, angle of adjustment: 90°/milling tool type: M680 D80 ZH6, material:
GGG 70, milling length/pass: 500 mm (without using cooling lubricants)

The single FIGURE shows a schematic illustration of the arrangement of the metal plates with respect to the rotating tool. The tool shown by the arrow 1 or a plurality of rotatably arranged tools run past two metal plates 2, which are arranged alongside one another and of which only one is visible in the drawing, and thereafter past the metal plates 3. The arrows 4 and 5 show the direction in which the evaporated metal flows. The sputtering rates of the separated titanium or aluminum, which determine the composition, have been varied by changing the electrical power of the targets. The separation of the two metals gives rise to a mixture only upon deposition on the workpiece which is guided past, which, as has been described, makes it possible for the nanostructured layer formation to be achieved.

The invention claimed is:

1. A tool for the cutting machining of workpieces, in particular for milling cast iron workpieces, wherein the tool comprises a coated cemented carbide body having at least one layer of TiAlN comprising crystallites, wherein the layer consists of $Ti_xAl_{1-x}N$, where 0.2≤x≤0.8, wherein the crystallites present in the TiAlN layer have a size of ≤10 nm and wherein the TiAlN layer further comprises a plurality of laminar plies to give an overall layer thickness of 0.01 µm to 3 µm.

2. The tool as claimed in claim 1, further comprising a plurality of TiAlN layers having differing Ti:Al ratios, the thickness of all the TiAlN layers being at most 10 µm.

3. The tool as claimed in claim 2, wherein the plurality of $Ti_xAl_{1-x}N$ layers vary in such a manner that an inner layer has a relatively large Al proportion, preferably where x<0.5, and a outer layer has a relatively small Al proportion, where 0.6≤x≤0.8.

4. The tool as claimed in claim 1, wherein the Ti in the $Ti_xAl_{1-x}N$ layer is replaced entirely or in part by Zr and/or Hf.

5. The tool as claimed in claim 1, wherein the Al in the $Ti_xAl_{1-x}N$ layer is replaced entirely or in part by Si and/or B and/or C and this layer has been produced by pulsed voltage sputtering.

6. The tool as claimed in claim 1, wherein the TiAlN layer is free of hexagonal phase.

7. The tool as claimed in claim 3, wherein the TiAlN layer is free of hexagonal phase.

8. The tool as claimed in claim 1, wherein the TiAlN layer contacts the cemented carbide body.

* * * * *